US008169753B2

(12) United States Patent
Lin

(10) Patent No.: US 8,169,753 B2
(45) Date of Patent: May 1, 2012

(54) CURRENT-PERPENDICULAR-TO-PLANE (CPP) READ SENSOR WITH FERROMAGNETIC AMORPHOUS BUFFER AND POLYCRYSTALLINE SEED LAYERS

(75) Inventor: Tsann Lin, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 715 days.

(21) Appl. No.: 12/276,003

(22) Filed: Nov. 21, 2008

(65) Prior Publication Data

US 2010/0128400 A1 May 27, 2010

(51) Int. Cl.
*G11B 5/39* (2006.01)
(52) U.S. Cl. ............ 360/324.12; 360/324.2; 428/811.1; 428/811.2; 428/811.5
(58) Field of Classification Search ........................ None
See application file for complete search history.

(56) References Cited

U.S. PATENT DOCUMENTS

| | | | | |
|---|---|---|---|---|
| 6,208,491 | B1* | 3/2001 | Pinarbasi | 360/324.1 |
| 6,275,360 | B1* | 8/2001 | Nakamoto et al. | 360/319 |
| 7,075,758 | B2 | 7/2006 | Zhang et al. | 360/319 |
| 7,130,166 | B2* | 10/2006 | Gill | 360/324.12 |
| 7,203,037 | B2 | 4/2007 | Gill | 360/314 |
| 7,248,449 | B1 | 7/2007 | Seagle | 36/324.2 |
| 7,342,751 | B2 | 3/2008 | Nagasaka et al. | 360/324.1 |
| 8,081,405 | B2* | 12/2011 | Lin | 360/324.2 |
| 8,094,421 | B2* | 1/2012 | Lin | 360/324.2 |
| 2003/0053270 | A1* | 3/2003 | Gill | 360/324.11 |
| 2006/0092577 | A1* | 5/2006 | Nagasaka et al. | 360/324.1 |
| 2007/0035886 | A1 | 2/2007 | Kagami et al. | 360/319 |
| 2007/0146928 | A1 | 6/2007 | Zhang et al. | 360/125 |
| 2007/0165336 | A1 | 7/2007 | Kamai et al. | 360/324.1 |
| 2007/0165338 | A1 | 7/2007 | Kamai et al. | 360/324.2 |
| 2007/0188944 | A1 | 8/2007 | Hoshino et al. | 360/324.12 |
| 2007/0211391 | A1* | 9/2007 | Hirata et al. | 360/319 |

(Continued)

FOREIGN PATENT DOCUMENTS

JP 2008-047739 2/2008

OTHER PUBLICATIONS

Diao et al., "Spin transfer switching in dual MgO magnetic tunnel junctions" Applied Physics Letters 90, 132508; 2007 American Institute of Physics.
Almeida et al., "Field detection in single and double barrier MgO magnetic tunnel junction sensors" Journal of Applied Physics 103, 07E922; 2008 American Institute of Physics.
Wang et al., "Abstract: S32.00005: Tunneling Magnetoresistance in MgO based double-barrier Magnetic Tunnel Junctions", http://absimage.aps.org/image/MWS_MAR08-2007-005735.pdf.

(Continued)

*Primary Examiner* — Kevin Bernatz
(74) *Attorney, Agent, or Firm* — Zilka-Kotab, PC

(57) ABSTRACT

A current-perpendicular-to-plane (CPP) tunneling magnetoresistance (TMR) or giant magnetoresistance (GMR) read sensor with ferromagnetic amorphous buffer and polycrystalline seed layers is disclosed for reducing a read gap, in order to perform magnetic recording at higher linear densities. The ferromagnetic amorphous buffer and polycrystalline seed layers couples to a ferromagnetic lower shield, thus acting as part of the ferromagnetic lower shield and defining the upper surface of the ferromagnetic polycrystalline seed layer as the lower bound of the read gap. In addition, a CPP TMR or GMR read sensor with nonmagnetic and ferromagnetic cap layers is also disclosed for reducing the read gap, in order to perform magnetic recording at even higher linear densities. The ferromagnetic cap layer couples to a ferromagnetic upper shield, thus acting as part of the ferromagnetic upper shield and defining the lower surface of the ferromagnetic cap layer as the upper bound of the read gap.

20 Claims, 14 Drawing Sheets

U.S. PATENT DOCUMENTS

| | | | |
|---|---|---|---|
| 2007/0230068 A1 | 10/2007 | Gill | 360/324.2 |
| 2008/0023740 A1* | 1/2008 | Horng et al. | 257/295 |
| 2008/0088986 A1* | 4/2008 | Horng et al. | 360/324.2 |
| 2008/0124581 A1* | 5/2008 | Miura et al. | 428/811.1 |
| 2009/0161268 A1* | 6/2009 | Lin | 360/324.11 |
| 2009/0251829 A1* | 10/2009 | Zhang et al. | 360/319 |

OTHER PUBLICATIONS

Feng et al., "Influence of annealing on bias voltage dependence of tunneling magnetoresistance in MgO double-barrier magnetic tunnel junctions with CoFeB electrodes", Applied Physics Letters 89, 162501; 2006 American Institute of Physics.

* cited by examiner

CURRENT-PERPENDICULAR-TO-PLANE (CPP) READ SENSOR WITH FERROMAGNETIC AMORPHOUS BUFFER AND POLYCRYSTALLINE SEED LAYERS

BACKGROUND OF THE INVENTION

1. Field of the Invention

The invention is related to non-volatile magnetic storage devices, and in particular to a hard disk drive including a current-perpendicular-to-plane (CPP) tunneling magnetoresistance (TMR) or giant magnetoresistance (GMR) read sensor with ferromagnetic amorphous buffer and polycrystalline seed layers also acting as ferromagnetic lower shields.

2. Statement of the Problem

In many non-volatile magnetic storage devices, a hard disk drive is the most extensively used to store data. The hard disk drive includes a hard disk and an assembly of write and read heads. The assembly of write and read heads is supported by a slider that is mounted on a suspension arm. When the hard disk rotates, an actuator swings the suspension arm to place the slider over selected circular data tracks on the hard disk. The suspension arm biases the slider toward the hard disk, and an air flow generated by the rotation of the hard disk causes the slider to fly on a cushion of air at a very low elevation (fly height) over the hard disk. When the slider rides on the air, the actuator moves the suspension arm to position the write and read heads over selected data tracks on the hard disk. The write and read heads write data to and read data from, respectively, data tracks on the hard disk. Processing circuitry connected to the write and read heads then operates according to a computer program to implement writing and reading functions.

In a reading process, the read head passes over magnetic transitions of a data track on the rotating hard disk, and magnetic fields emitting from the magnetic transitions modulate the resistance of a read sensor in the read head. Changes in the resistance of the read sensor are detected by a sense current passing through the read sensor, and are then converted into voltage changes that generate read signals. The resulting read signals are used to decode data encoded in the magnetic transitions of the data track.

In a typical read head, a current-perpendicular-to-plane (CPP) giant magnetoresistance (GMR) or tunneling magnetoresistance (TMR) read sensor is electrically separated by side oxide layers from longitudinal bias layers in two side regions in order to prevent a sense current from shunting into the two side regions, but is electrically connected with ferromagnetic lower and upper shields, allowing the sense current to flow through the CPP read sensor in a direction perpendicular to the sensor plane. A typical CPP TMR read sensor comprises an electrically insulating barrier layer sandwiched between the lower and upper sensor stacks. The barrier layer is formed by a nonmagnetic $MgO_x$ film having a thickness ranging from 0.4 to 1 nm. When the sense current quantum jumps across the $MgO_x$ barrier layer, changes in the resistance of the CPP TMR read sensor are detected through a TMR effect. A typical CPP GMR read sensor comprises an electrically conducting spacer layer sandwiched between lower and upper sensor stacks. The spacer layer is formed by a nonmagnetic Cu or oxygen-doped Cu (Cu—O) film having a thickness ranging from 1.6 to 4 nm. When the sense current flows across the Cu or Cu—O spacer layer, changes in the resistance of the CPP GMR read sensor are detected through a GMR effect.

The lower sensor stack of the CPP TMR read sensor typically comprises a buffer layer formed by a nonmagnetic Ta film, a seed layer formed by a nonmagnetic Ru film, a pinning layer formed by an antiferromagnetic Ir-Mn film, and a flux-closure structure. The flux closure structure comprises a keeper layer formed by a ferromagnetic Co—Fe film, an antiparallel coupling layer formed by a nonmagnetic Ru film, and a reference layer formed by a ferromagnetic Co—Fe—B film. Four fields are induced in the flux-closure structure. First, a unidirectional anisotropy field ($H_{UA}$) is induced by exchange coupling between the pinning and keeper layers. Second, an antiparallel-coupling field ($H_{APC}$) is induced by antiparallel coupling between the keeper and reference layers and across the antiparallel-coupling layer. Third, a demagnetizing field ($H_D$) is induced by the net magnetization of the keeper and reference layers. Fourth, a ferromagnetic-coupling field ($H_F$) is induced by ferromagnetic coupling between the reference and sense layers and across the barrier layer. To ensure proper sensor operation, $H_{UA}$ and $H_{APC}$ must be high enough to rigidly pin magnetizations of the keeper and reference layers in opposite transverse directions perpendicular to an air baring surface (ABS), while $H_D$ and $H_F$ must be small and balance with each other to orient the magnetization of a sense layer in a longitudinal direction parallel to the ABS.

The upper sensor stack of the CPP TMR read sensor typically comprises a sense layer formed by a ferromagnetic Co—Fe—B film and a cap layer formed by a nonmagnetic Ta film. Both the Co—Fe—B reference and sense layers exhibit a "soft" amorphous phase after deposition, which will be transformed into a polycrystalline phase after annealing. With this crystallization, a Co—Fe—B(001)[110]//$MgO_x$(001)[100]//Co—Fe—B(001)[110] epitaxial relationship is developed, and thus the TMR effect is substantially enhanced.

In order for the read head to perform magnetic recording at densities beyond 400 Gb/in$^2$, its sensor width has been progressively reduced to below 50 nm for increasing track densities, while its read gap (defined as a distance between the ferromagnetic lower and upper shields) has been progressively reduced to below 30 nm for increasing linear densities. A further reduction in the sensor width poses a stringent photolithography challenge, while a further reduction in the read gap poses an inevitable sensor miniaturization challenge.

SUMMARY

The invention provides a current-perpendicular-to-plane (CPP) tunneling magnetoresistance (TMR) or giant magnetoresistance (GMR) read sensor with ferromagnetic amorphous buffer and polycrystalline seed layers also acting as ferromagnetic lower shields.

The ferromagnetic amorphous buffer layer is preferably formed by a Co—Fe—X film (where X is Hf, Zr or Y). The ferromagnetic amorphous Co—Fe—X buffer layer provides the CPP read sensor with microstructural discontinuity from a ferromagnetic lower shield, thus facilitating the CPP read sensor to grow freely with preferred crystalline textures, and with ferromagnetic continuity to the ferromagnetic lower shield, thus acting as part of the ferromagnetic lower shield.

The ferromagnetic polycrystalline seed layer is preferably formed by a Ni—Fe or Ni—Fe—X film (where X is Cu, Cr, Rh, Ru, Ti or W) exhibiting a face-centered-cubic (fcc) structure. The ferromagnetic polycrystalline Ni—Fe or Ni—Fe—X seed layer provides the CPP read sensor with an epitaxial relationship, thus facilitating the CPP read sensor to grow with preferred crystalline textures, thereby exhibiting high pinning fields and good TMR properties, and with ferromagnetic continuity to the ferromagnetic lower shield, thus also acting as part of the ferromagnetic lower shield.

These and other features and advantages of the invention will be apparent upon reading the following detailed description of preferred embodiments taken in conjunction with the Figures in which like reference numerals indicate like elements throughout.

DESCRIPTION OF THE DRAWINGS

The same reference number represents the same element or same type of element on all drawings.

Figure 9:
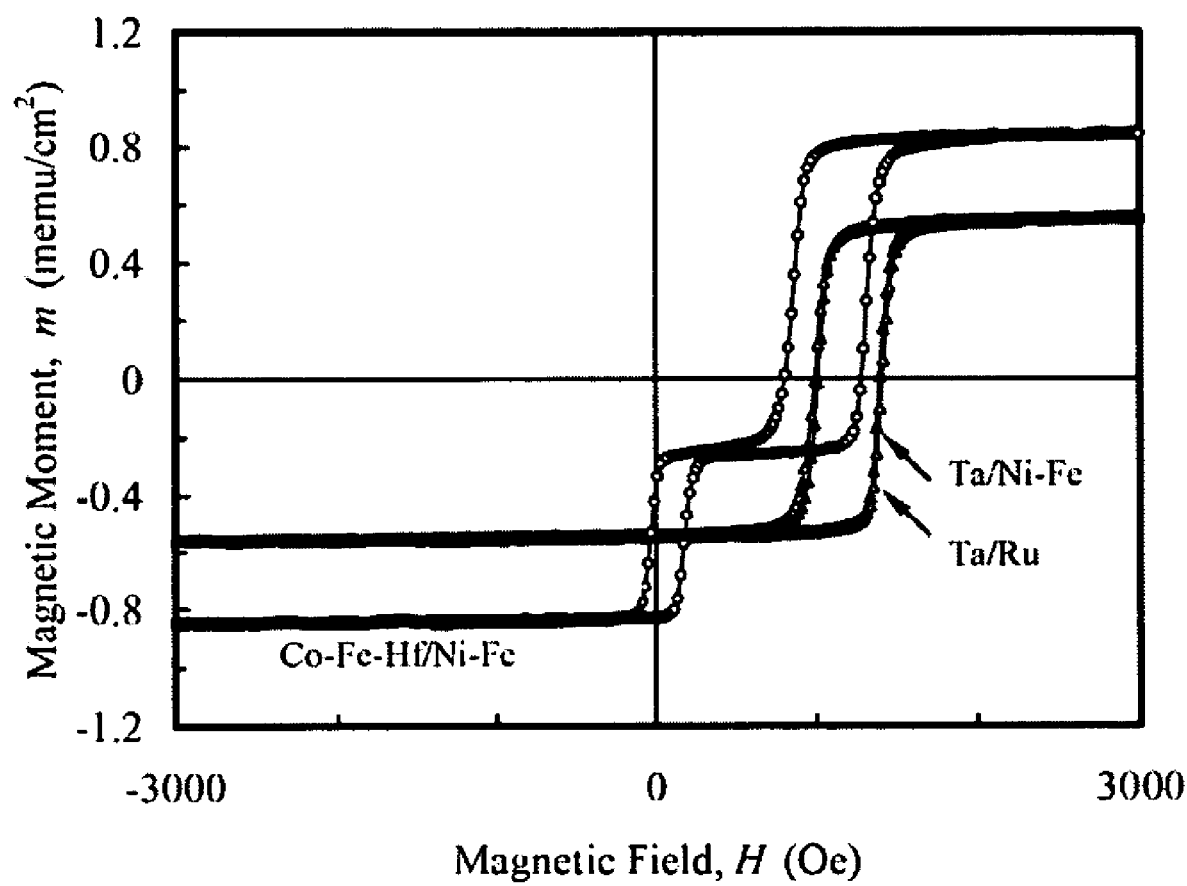
FIG. 9 is a chart showing easy-axis magnetic responses of 21.7Ir-78.3Mn(6)/77.5Co-22.5Fe(3.6) films with various buffer/seed layers and Ru(3)/Ta(3)/Ru(4) cap layers after annealing for 2 hours at 280° C. The buffer/seed layers comprise Ta(2)/Ru(2), Ta(2)/91.3Ni-8.7Fe(2) and 66.9Co-9.6Fe-23.5Hf(4)/91.3Ni-8.7Fe(2) films.

Table 1 is a table summarizing $m_s$, $H_{CE}$, $H_{UA}$ and $J_K$ determined from the substantially shifted hysteresis loops of the 21.7Ir-78.3Mn(6)/77.5Co-22.5Fe(3.6) films shown in FIG. 9.

DETAILED DESCRIPTION OF THE INVENTION

FIGS. 1-14 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific exemplary embodiments described below, but only by the claims and their equivalents.

Figure 1:
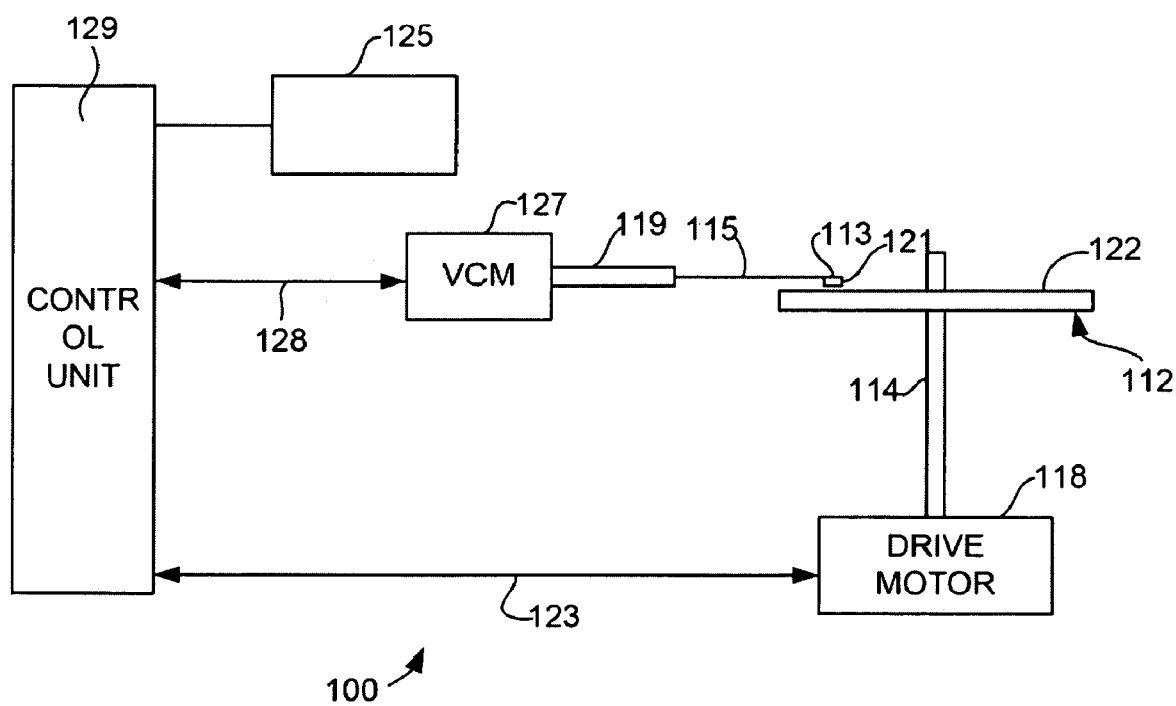
FIG. 1 is a schematic diagram illustrating a hard disk drive used as a non-volatile magnetic storage device.

Referring now to FIG. 1, there is shown a hard disk drive 100 embodying the invention. As shown in FIG. 1, at least one rotatable hard disk 112 is supported on a spindle 114 and rotated by a disk drive motor 118. The magnetic recording is performed in the form of annular patterns of concentric data tracks (not shown) on the hard disk 112.

At least one slider 113 is positioned near the hard disk 112, each slider 113 supporting one or more assemblies of write and read heads 121. As the hard disk 112 rotates, the slider 113 moves radially in and out over the disk surface 122 so that the assembly of write and read heads 121 may access different tracks of the hard disk 112 where desired data are written. The slider 113 is attached to a suspension 115, which provides a slight spring force to bias the slider 113 against the disk surface 122. The suspension 115 is attached to an actuator arm 119, and the actuator arm 119 is attached to an actuator means 127. The actuator means 127 may be a voice coil motor (VCM) comprising a coil movable within a fixed magnetic field. The direction and speed of the coil movements in the VCM is controlled by the motor current signals supplied by a control unit 129.

During operation of the hard disk drive 100, the rotation of the hard disk 112 generates an air bearing between the slider 113 and the disk surface 122 which exerts an upward force or lift on the slider 113. The air bearing thus counter-balances the slight spring force of suspension 115 and supports the slider 113 off and slightly above the disk surface 122 by a small, substantially constant spacing during sensor operation.

The various components of the hard disk drive 100 are controlled in operation by control signals generated by the control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position the slider 113 to the desired data track on the hard disk 112. Write and read signals are communicated to and from write and read heads, respectively, by way of a recording channel 125.

Figure 2:
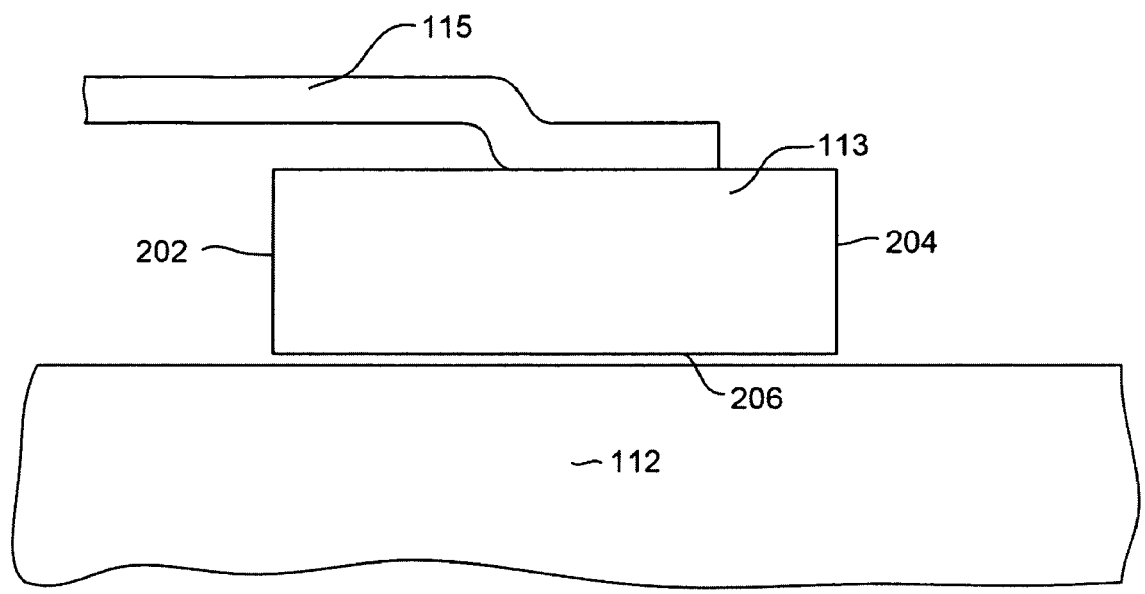
FIG. 2 is a schematic diagram illustrating a side view of a portion of a hard disk drive.

FIG. 2 is a side view of a portion of the hard disk drive 100. The slider 113 is supported above the hard disk 112. The slider 113 includes a front end 202 and an opposing trailing end 204. The slider 113 also includes an air bearing surface (ABS) 206 that faces toward the surface of the hard disk 112. The assembly of write and read heads (not shown) 121 is formed proximate to the trailing end 204, which is further illustrated in FIG. 3.

Figure 3:
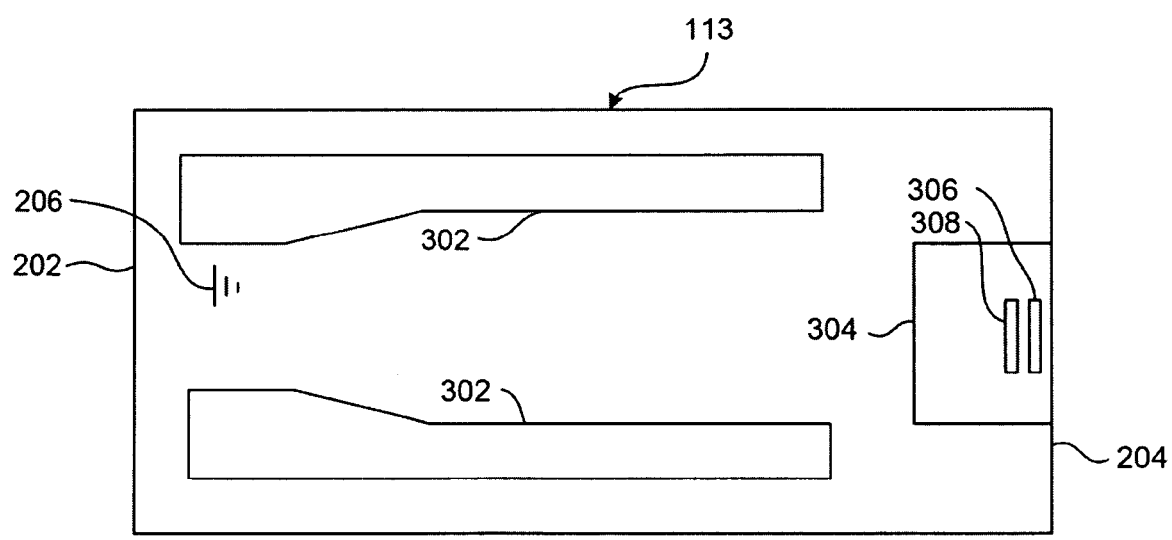
FIG. 3 is a schematic diagram illustrating an ABS view of a slider.

FIG. 3 is an ABS view of the slider 113. The ABS 206 of the slider 113 is the surface of the page in FIG. 3. The slider 113 may include rails 302 and one or more pads 304 formed on the ABS 206. The rails 302 and pads 302, 304, which define how the slider 113 flies over the surface of the hard disk 112, illustrate just one embodiment, and the configuration of the ABS 206 of the slider 113 may take on any desired form. The slider 113 includes a write head 306 and a read head 308 fabricated proximate to the trailing end 204.

Figure 4:
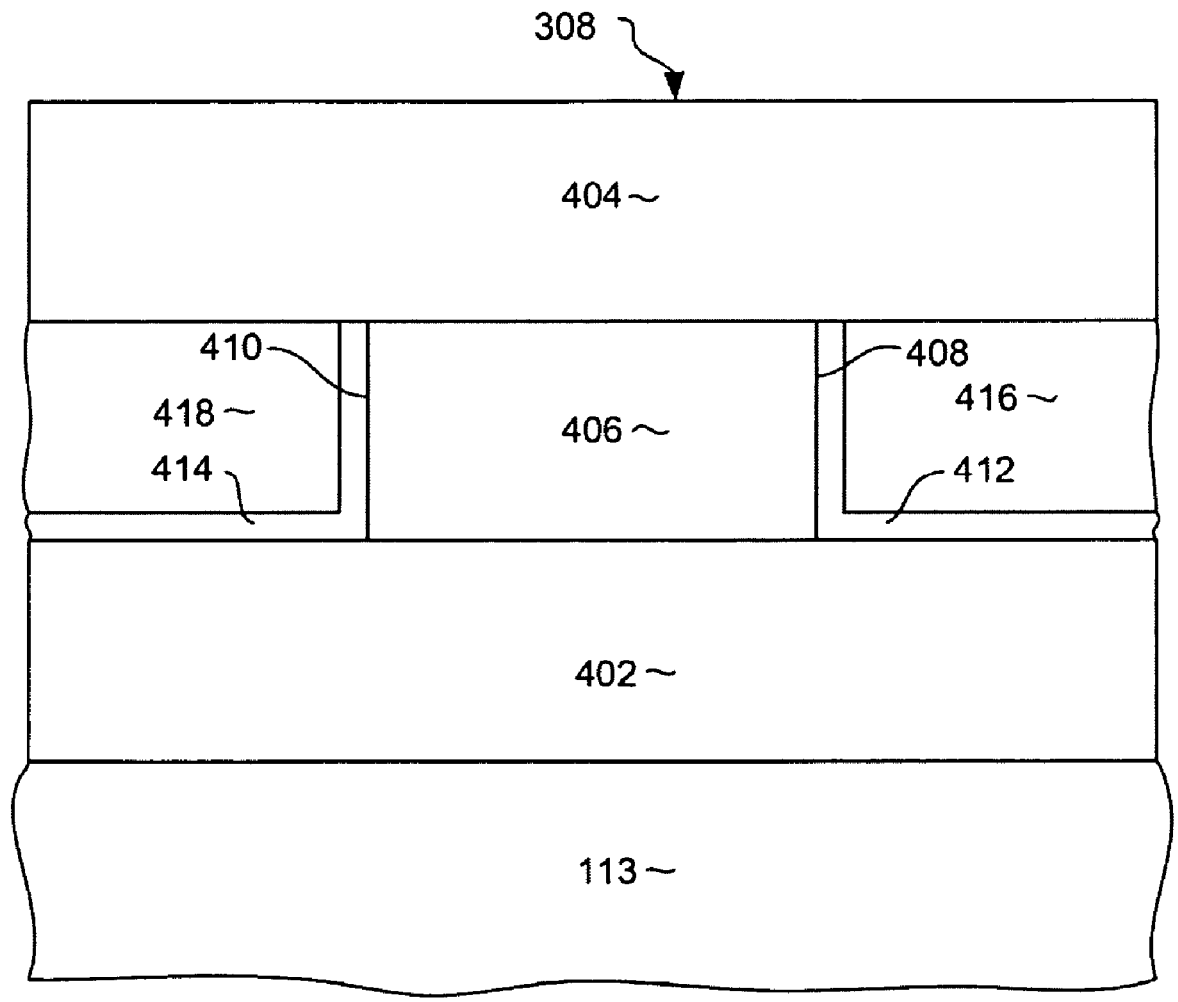
FIG. 4 is a schematic diagram illustrating an ABS view of a read head fabricated on a slider.

FIG. 4 illustrates an ABS view of a read head 308 fabricated on the slider 113. The read head 308 includes a lower shield 402 and an upper shield 404. A read sensor 406 having first and second side regions 408, 410 is sandwiched between the lower and upper shields 402, 404. In the two side regions 408, 410, side oxide layers 412, 414 separate longitudinal bias layers 416, 418, respectively, from the lower shield 402 and the read sensor 406.

Figure 5:
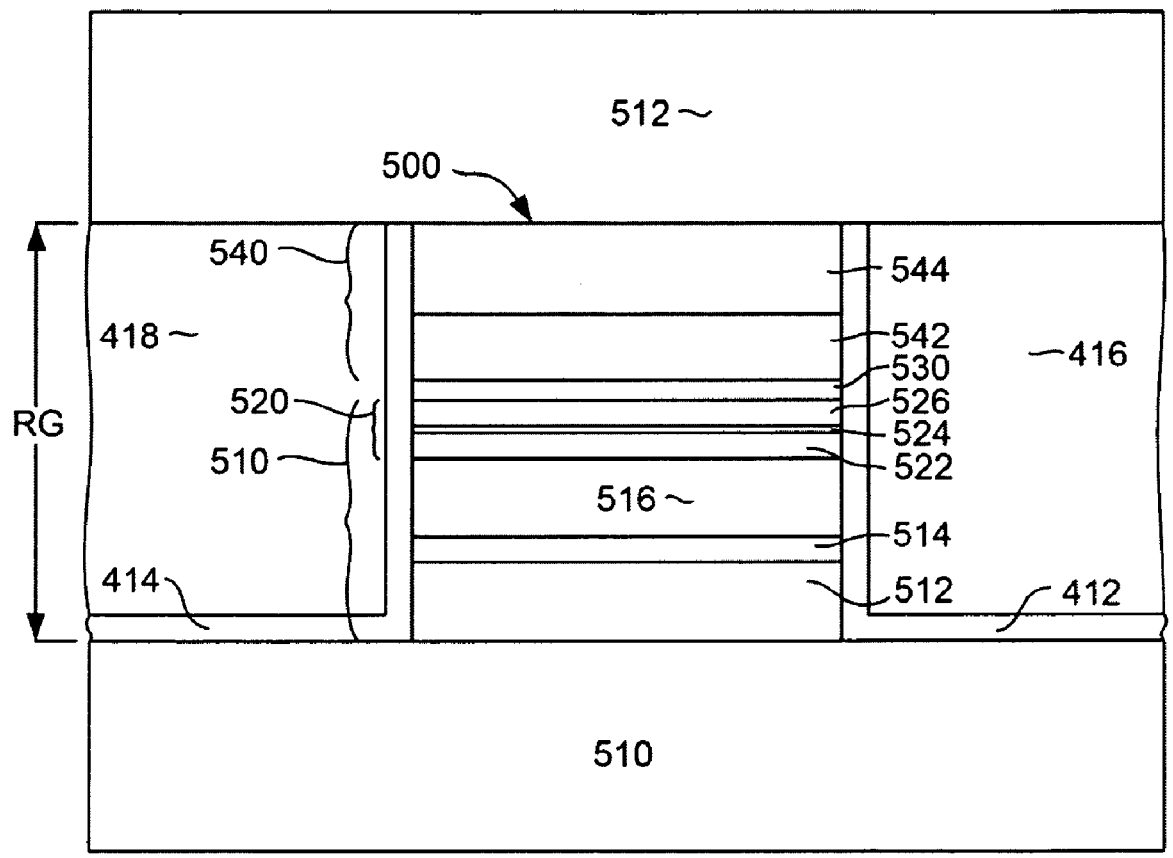
FIG. 5 is a schematic diagram illustrating an ABS view of a CPP TMR read sensor used in a prior art.

FIG. 5 illustrates an ABS view of a CPP TMR read sensor 500 used in a prior art. The CPP TMR read sensor 500 includes an electrically insulating $MgO_x$ barrier layer 530 sandwiched between a lower sensor stack 510 and an upper sensor stack 540. The lower sensor stack 510 comprises a buffer layer 512 formed by a nonmagnetic Ta film, a seed layer 514 formed by a nonmagnetic Ru or Ni—Fe film, a pinning layer 516 formed by an antiferromagnetic Ir-Mn film, and a flux closure structure 520. The flux closure structure 520 comprises a keeper layer 522 formed by a ferromagnetic Co—Fe film, an antiparallel coupling layer 524 formed by a nonmagnetic Ru film, and a reference layer 526 formed by a ferromagnetic Co—Fe—B film. The upper sensor stack 540 comprises a sense layer 542 formed by a ferromagnetic Co—Fe—B film and a cap layer 544 formed by a nonmagnetic Ta film.

Since the Ta buffer layer 512 is nonmagnetic, it provides a magnetic discontinuity between the Ni—Fe lower shield 510 and the CPP TMR read sensor 500, and thus its lower surface defines the lower bound of the read gap (RG). Since the Ta buffer layer 512 exhibits a body-centered-cubic (bcc) structure while the Ni—Fe lower shield 510 exhibits a face-centered-cubic (fcc) structure, the Ta buffer layer 512 also provides a microstructural discontinuity between the Ni—Fe lower shield 510 and the TMR read sensor 500, and may reduce the effect on the development of crystalline textures in the TMR read sensor 500. Since the Ru seed layer 514 exhibits a hexagonal-closed-packed (hcp) structure (which is formed by two types of closest-packed monolayers) while the Ni—Fe seed layer 514 and the Ir-Mn pinning layer 516 exhibits an fcc structure (which is formed by three types of closest-packed monolayers), the Ru (or Ni—Fe) seed layer 514 provides an epitaxial relationship between the Ru (or Ni—Fe) seed layer 514 and the Ir-Mn pinning layer 516, thereby facilitating the Ir-Mn pinning layer 516 to grow with a preferred crystalline texture needed for high pinning fields.

Figure 6:
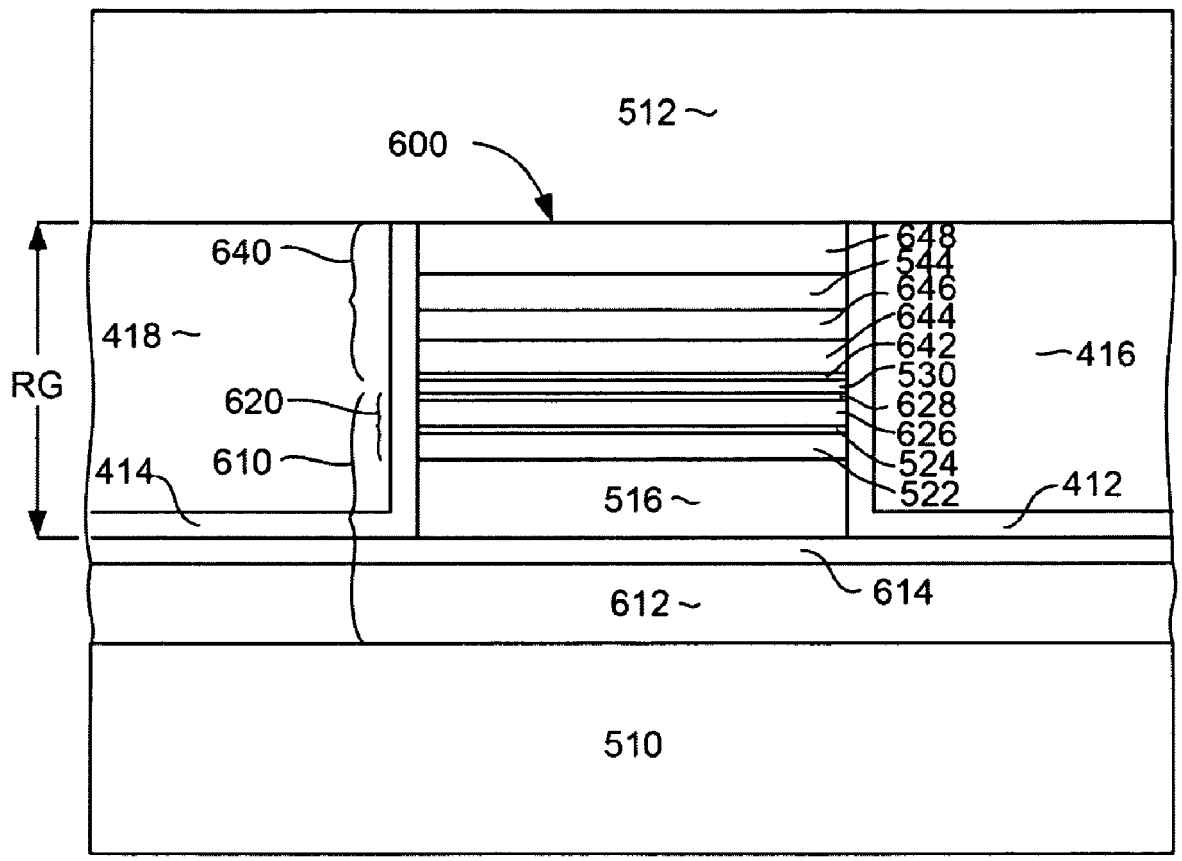
FIG. 6 is a schematic diagram illustrating an ABS view of a CPP TMR read sensor in accordance with a preferred embodiment of the invention.

FIG. 6 illustrates an ABS view of a CPP TMR read sensor 600 in accordance with a preferred embodiment of the invention. The TMR read sensor 600 includes an electrically insulating $MgO_x$ barrier layer 530 sandwiched between a lower sensor stack 610 and an upper sensor stack 640.

The lower sensor stack 610 comprises a buffer layer 612 formed by a 4 nm thick ferromagnetic amorphous 66.9Co-9.6Fe-23.5Hf film (composition in atomic percent), a seed layer 614 formed by a 2 nm thick ferromagnetic polycrystalline 91.3Ni-8.7Fe film, a pinning layer 516 formed by a 6 nm thick antiferromagnetic 21.7Ir-78.3Mn film, and a flux closure structure 620. The flux closure structure 620 comprises a keeper layer 522 formed by a 2 nm thick ferromagnetic 77.5Co-22.5Fe film, an antiparallel coupling layer 524 formed by a 0.8 nm thick nonmagnetic Ru film, a first reference layer 626 formed by a 1.6 nm thick ferromagnetic 65.6Co-19.9Fe-14.5B film, and a second reference layer 628 formed by a 0.4 nm thick ferromagnetic 77.5Co-22.5Fe film. Thicknesses of the Co—Fe keeper and Co—Fe—B/Co—Fe reference layers are fixed in order to attain designed saturation moments ($m_s$) of 0.25 and 0.24 memu/cm² (equivalent to those of 3.6 and 3.4 nm thick 80Ni-20Fe films sandwiched between two Cu films, respectively), respectively, for ensuring proper sensor operation.

More generally, the buffer layer 612 may be formed by a Co—Fe—X film (where X is Hf, Zr or Y) containing Co with a content ranging from 60 to 80 at %, Fe with a content ranging from 0 to 40 at %, and X with a content ranging from 6 to 30 at %, and having a thickness ranging from 0.4 to 20 nm. The seed layer 614 may be formed by a Ni—Fe—X film (where X is Cu, Cr, Rh, Ru, Ti or W) containing Ni with a content ranging from 60 to 100 at %, Fe with a content ranging from 0 to 40 at %, and X with a content ranging from 0 to 10 at %, and having a thickness ranging from 2 to 40 nm. The Co—Fe keeper layer 522 may contain Co with a content ranging from 50 to 90 at % and Fe with a content ranging from 10 to 50 at %, and have a thickness ranging from 1.6 to 3.2 nm. The Co—Fe—B first reference layer 626 may contain Co with a content ranging from 60 to 80 at %, Fe with a content ranging from 0 to 40 at %, and B with a content ranging from 6 to 30 at %, and have a thickness ranging from 1 to 4 nm. The Co—Fe second reference layer 628 may contain Co with a content ranging from 50 to 90 at % and Fe with a content ranging from 10 to 50 at %, and have a thickness ranging from 0.4 to 2 nm.

In the preferred embodiment of the invention, since both the Co—Fe—Hf buffer layer 612 and the Ni—Fe seed layer 614 are ferromagnetic, they provide magnetic continuities between the lower shield 510 and the CPP TMR read sensor 600, and thus the upper surface of the Ni—Fe seed layer 614 defines the lower bound of the read gap. Since the Co—Fe—Hf buffer layer is amorphous, it provides a microstructural discontinuity between the lower shield 510 and the CPP TMR read sensor 600, and thus establishes a new foundation for the CPP TMR read sensor 600 to grow freely. Since the Ni—Fe seed layer 614 exhibits the fcc structure, it provides an epitaxial relationship between the Ni—Fe seed layer 614 and the Ir-Mn pinning layer 516, thus facilitating the Ir-Mn pinning layer 516 to grow with a preferred crystalline texture needed for high pinning fields.

In the prior art, the Ni—Fe seed layer in contact with the Ta buffer and Ir-Mn pinning layers must be thin enough to ensure high linear resolution, since it acts as part of the read gap, and to prevent the CPP TMR read sensor from exhibiting operational instability, since its residual magnetization is moderately pinned by the Ir-Mn pinning layer. In the invention, by contrast, the Ni—Fe seed layer in contact with the Co—Fe—Hf buffer and Ir-Mn pinning layers can be as thick as desired to reinforce the epitaxial relationship needed for enhancing pinning and TMR properties since it acts as part of the lower shield, while the sensor operation is not interrupted since its residual magnetization is free from the Ir-Mn pinning layer after ferromagnetic coupling to the Co—Fe—Hf buffer layer and the Ni—Fe lower shield. The thick Ni—Fe seed layer, however, requires a plasma treatment to remove unwanted grain boundary grooving on top of columnar polycrystalline grains. As a result, the thick Ni—Fe seed layer may exhibit a smoothened surface with large polycrystalline grains, thus facilitating the TMR read sensor to further enhance pinning and TMR properties.

The upper sensor stack 640 comprises a first sense layer 642 formed by a 0.4 nm thick ferromagnetic 87.1Co-12.9Fe film, a second sense layer 644 formed by a 1.6 nm thick ferromagnetic 71.5Co-7.4Fe-21.1B film, a third sense layer 646 formed by a 1.6 nm thick ferromagnetic 74.0Co-10.8Fe-15.2Hf film, a first cap layer 544 formed by a 2 nm thick nonmagnetic Ta film, and a second cap layer 648 formed by a 6 nm thick ferromagnetic 80Ni-20Fe film. The total thickness of the Co—Fe/Co—Fe—B/Co—Fe—Hf sense layers 642, 644, 646 is fixed in order to attain a designed magnetic moment of 0.32 memu/cm$^2$ (equivalent to that of a 4.5 nm thick 80Ni-20Fe film sandwiched between two Cu films) for achieving high read sensitivity.

More generally, the Co—Fe first sense layer 642 may contain Co with a content ranging from 50 to 90 at % and Fe with a content ranging from 10 to 50 at %, and have a thickness ranging from 0.4 to 2 nm. The Co—Fe—B second sense layer 644 may contain Co with a content ranging from 60 to 80 at %, Fe with a content ranging from 0 to 40 at %, and B with a content ranging from 6 to 30 at %, and have a thickness ranging from 1 to 4 nm. The third sense layer 646 may be formed by a Co—Fe—X film (where X is Hf, Zr or Y) containing Co with a content ranging from 60 to 80 at %, Fe with a content ranging from 0 to 40 at %, and X with a content ranging from 6 to 30 at %, and having a thickness ranging from 1 to 4 nm. The second cap layer 648 can be formed by a Ni—Fe—X film (where X is Cu, Cr, Rh, Ru, Ti or W) containing Ni with a content ranging from 60 to 100 at %, Fe with a content ranging from 0 to 40 at %, and Y with a content ranging from 0 to 10 at %, and having a thickness ranging from 2 to 40 nm.

In the prior art, the nonmagnetic cap layer is preferably thin to ensure high linear resolution since it acts as part of the read gap, but also preferably thick enough to eliminate chemical and mechanical processes induced damage since it acts as a protection layer to the sense layers. In the invention, by contrast, the first cap layer can be as thin as desired as long as it is nonmagnetic and causes ferromagnetic decoupling between the sense and second cap layers. On the other hand, the second cap layer can be as thick as desired for protecting the sense layers as long as it is ferromagnetic since it acts as part of the upper shield. The thick Ni—Fe second cap layer, however, requires heavy sputter etching before forming the upper shield, to remove chemical and mechanical damages in processing and to expose a cleaned surface for ferromagnetic coupling to the upper shield. As a result, the lower surface of the second cap layer defines the upper bound of the read gap.

In the prior art, the CPP TMR read sensors with sense layers symmetrical and asymmetrical to the lower and upper shields provide 34.8 and 25.2 nm thick read gaps, respectively. In the invention, by contrast, the CPP TMR read sensors with sense layers symmetrical and asymmetrical to the lower and upper shields provide 26.8 and 17.2 nm thick read gaps, respectively. This substantial reduction in the read gap is expected to provide much higher linear resolution in magnetic recording.

Figure 7:
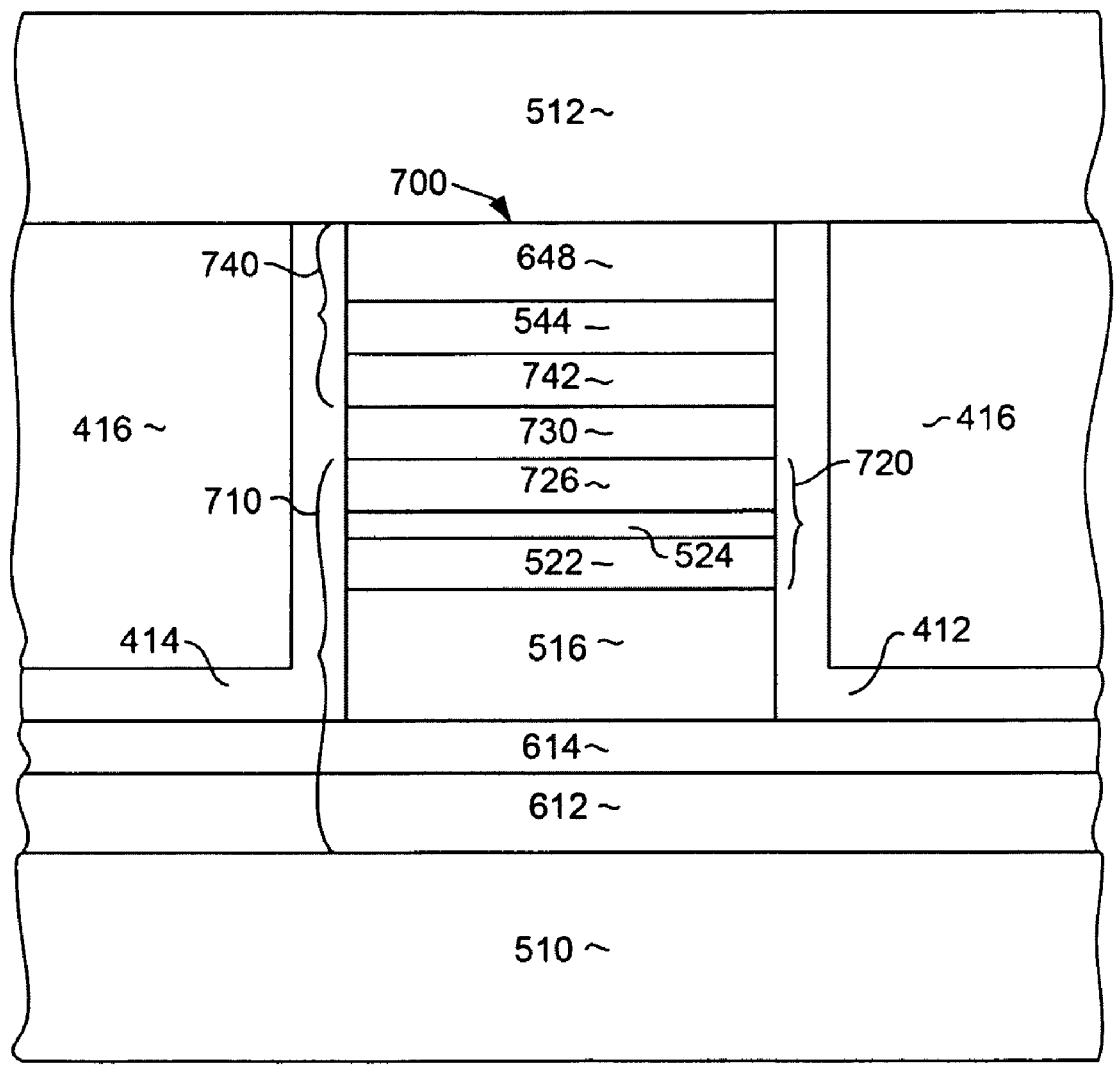
FIG. 7 is a schematic diagram illustrating an ABS view of a CPP GMR read sensor in accordance with an alternative embodiment of the invention.

FIG. 7 illustrates an ABS view of a CPP GMR read sensor 700 in accordance with an alternative embodiment of the invention. The CPP GMR read sensor 700 includes an electrically conducting Cu—O spacer 730 sandwiched between a lower sensor stack 710 and an upper sensor stack 740.

The lower sensor stack 710 comprises a buffer layer 612 formed by a 4 nm thick ferromagnetic amorphous 66.9Co-9.6Fe-23.5Hf film, a seed layer 614 formed by a 2 nm thick ferromagnetic polycrystalline 91.3Ni-8.7Fe film, a pinning layer 516 formed by a 6 nm thick antiferromagnetic 21.7Ir-78.3Mn film, and a flux closure structure 720. The flux closure structure 720 comprises a keeper layer 522 formed by a 2 nm thick ferromagnetic 77.5Co-22.5Fe film, an antiparallel coupling layer 524 formed by a 0.8 nm thick nonmagnetic Ru film, and a reference layer 726 formed by a 1.6 nm thick ferromagnetic 50Co-50Fe film. Thicknesses of the 77.5Co-22.5Fe keeper and 50Co-50Fe reference layers are fixed in order to attain designed saturation moments (m$_s$) of 0.25 and 0.24 memu/cm$^2$ (equivalent to those of a 3.6 and 3.4 nm thick 80Ni-20Fe films sandwiched between two Cu films, respectively), respectively, for ensuring proper sensor operation. An additional reference layer formed by a Co—Fe—X film (where X is Hf, Zr, Y, Al, Ge or Si) with high electrical resistivity may be incorporated into the flux closure structure 720.

The upper sensor stack 740 comprises a sense layer 742 formed by a 2.4 nm thick ferromagnetic 87.1Co-12.9Fe film, a first cap layer 544 by a 2 nm thick nonmagnetic Ta film, and a second cap layer 648 formed by a 6 nm thick ferromagnetic 80Ni-20Fe film. The thickness of the Co—Fe sense layer 742 is fixed in order to attain a designed magnetic moment of 0.32 memu/cm$^2$ (equivalent to that of a 4.5 nm thick 80Ni-20Fe film sandwiched between two Cu films) for achieving high read sensitivity. An additional sense layer formed by a Ni—Fe—X film (where X is Cu, Cr, Rh, Ru, Ti or W) with high electrical resistivity may be incorporated into the upper sensor stack 740.

More generally, the Co—Fe reference layer 726 may contain Co with a content ranging from 50 to 90 at % and Fe with a content ranging from 10 to 50 at %, and have a thickness ranging from 1.6 to 3.2 nm. The additional Co—Fe—X reference layer (where X is Hf, Zr, Y, Al, Ge or Si) may contain Co with a content ranging from 60 to 80 at %, Fe with a content ranging from 0 to 40 at %, and X with a content ranging from 6 to 30 at %, and having a thickness ranging from 1 to 4 nm. The additional Ni—Fe—X sense layer (where X is Cu, Cr, Rh, Ru, Ti or W) may contain Ni with a content ranging from 60 to 100 at %, Fe with a content ranging from 0 to 40 at %, and X with a content ranging from 0 to 10 at %, and having a thickness ranging from 2 to 4 nm.

Figure 8:
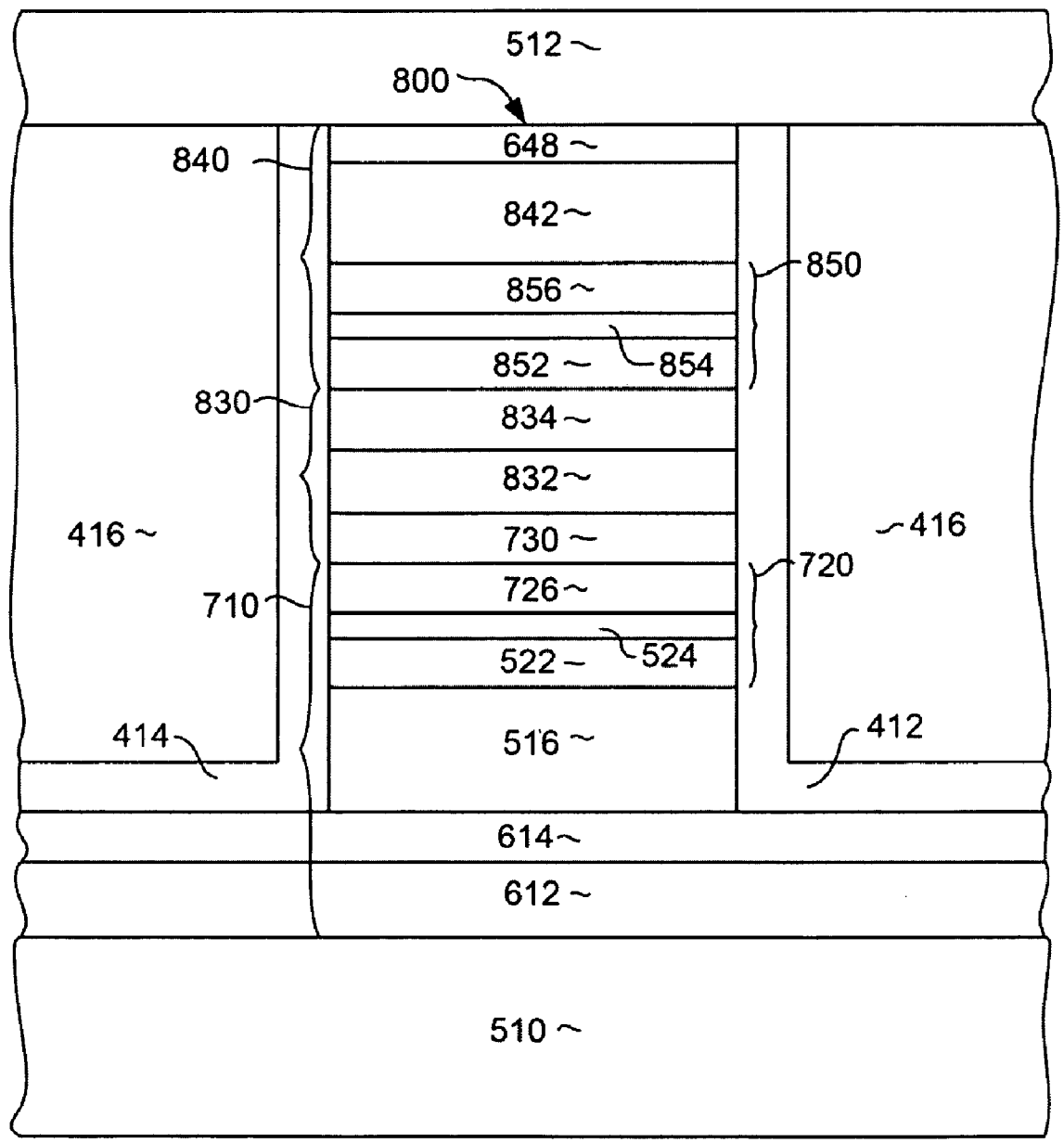
FIG. 8 is a schematic diagram illustrating an ABS view of a dual CPP GMR read sensor in accordance with a further alternative embodiment of the invention.

FIG. 8 illustrates an ABS view of a dual CPP GMR read sensor 800 in accordance with a further alternative embodiment of the invention. The dual CPP GMR read sensor 800 includes a lower sensor stack 710, a middle sensor stack 830, and an upper sensor stack 840.

The lower sensor stack 710 comprises a buffer layer 612 formed by a 4 nm thick ferromagnetic amorphous 66.9Co-9.6Fe-23.5Hf film, a seed layer 614 formed by a 2 nm thick ferromagnetic polycrystalline 91.3Ni-8.7Fe film, a first pinning layer 516 formed by a 6 nm thick antiferromagnetic 21.7Ir-78.3Mn film, and a first flux closure structure 720. The first flux closure structure 720 comprises a first keeper layer 522 formed by a 2 nm thick ferromagnetic 77.5Co-22.5Fe film, a first antiparallel coupling layer 524 formed by a 0.8 nm thick nonmagnetic Ru film, and a first reference layer 726 formed by a 1.6 nm thick ferromagnetic 50Co-50Fe film. Thicknesses of the 77.5Co-22.5Fe keeper and 50Co-50Fe reference layers are fixed in order to attain designed saturation moments (m$_s$) of 0.25 and 0.24 memu/cm$^2$ (equivalent to those of a 3.6 and 3.4 nm thick 80Ni-20Fe films sandwiched between two Cu films, respectively), respectively, for ensuring proper sensor operation. An additional reference layer formed by a Co—Fe—X film (where X is Hf, Zr, Y, Al, Ge or Si) with high electrical resistivity may be incorporated into the first flux closure structure 720.

The middle sensor stack 830 comprises a first electrically conducting Cu—O spacer layer 730, a sense layer 832 formed by a 2 nm thick ferromagnetic 87.1Co-12.9Fe film, and a second electrically conducting Cu—O spacer layer 834. The thickness of the Co—Fe sense layer 832 is fixed in order to attain a designed magnetic moment of 0.32 memu/cm$^2$ (equivalent to that of a 4.5 nm thick 80Ni-20Fe film sandwiched between two Cu films) for achieving high read sensitivity. An additional sense layer formed by a Ni—Fe—X (where X is Cu, Cr, Rh, Ru, Ti or W) film with high electrical resistivity may be incorporated into the middle sensor stack 830.

The upper sensor stack 840 comprises a second flux closure structure 850, a second pinning layer 842 formed by a 6 nm thick antiferromagnetic 21.7Ir-78.3Mn film, and a cap layer 648 formed by a 6 nm thick ferromagnetic 80Ni-20Fe film. The second flux closure structure 850 comprises a second reference layer 852 formed by a 1.6 nm thick ferromagnetic 50Co-50Fe film, a second antiparallel coupling layer 854 formed by a 0.8 nm thick nonmagnetic Ru film, and a second keeper layer 856 formed by a 2 nm thick ferromagnetic 77.5Co-22.5Fe film. Thicknesses of the 50Co-50Fe second reference and 77.5Co-22.5Fe second keeper layers are fixed in order to attain designed saturation moments ($m_s$) of 0.24 and 0.25 memu/cm$^2$ (equivalent to those of a 3.4 and 3.6 nm thick 80Ni-20Fe films sandwiched between two Cu films, respectively), respectively, for ensuring proper sensor operation. An additional reference layer formed by a Co—Fe—X film (where X is Hf, Zr, Y, Al, Ge or Si) with high electrical resistivity may be incorporated into the second flux closure structure 850.

FIG. 9 shows easy-axis magnetic responses of 21.7Ir-78.3Mn(6)/77.5Co-22.5Fe(3.6) films (thickness in nm) with various buffer/seed layers and Ru(3)/Ta(3)/Ru(4) cap layers after annealing for 2 hours at 280° C. The buffer/seed layers comprise Ta(2)/Ru(2), Ta(2)/91.3Ni-8.7Fe(2) and 66.9Co-9.6Fe-23.5Hf(4)/91.3Ni-8.7Fe(2) films. The thickness of the Co—Fe film is selected in order to attain a desired $m_s$ of 0.56 memu/cm$^2$, equivalent to that of an 8 nm thick 80Ni-20Fe film sandwiched between two Cu films. Exchange coupling occurring between the Ir-Mn and Co—Fe films can be realized from a hysteresis loop formed when the moment (m) of the Co—Fe film varies as function of a magnetic field (H). The exchange coupling increases the easy-axis coercivity ($H_{CE}$) of the Co—Fe film which is determined by the half width of the hysteresis loop, and also induces a unidirectional anisotropy field ($H_{UA}$) which is determined by the shift of the hysteresis loop. An exchange coupling energy ($J_K$), determined by the product of a saturation magnetization ($M_s$), the Co—Fe film thickness ($\delta_{CF}$) and $H_{UA}$, is typically used to characterize an intrinsic pinning strength needed for proper sensor operation.

Table 1 summarizes $m_s$, $H_{CE}$, $H_{UA}$ and $J_K$ determined from the substantially shifted hysteresis loops of the Ir-Mn/Co—Fe films as shown in FIG. 7. The $m_s$ of the 2 nm thick. Ni—Fe seed layer sandwiched between the Ta buffer and Ir-Mn pinning layers cannot be detected at all, indicating a moment loss of as large as ~0.14 memu/cm$^2$ caused by mixing at interfaces between the Ta buffer and Ni—Fe seed layers and between the Ni—Fe seed and Ir-Mn pinning layers. On the other hand, the $m_s$ of the Co—Fe—Hf buffer and Ni—Fe seed layers can be determined to be 0.28 memu/cm$^2$ from a hysteresis loop slightly shifted by 69.7 Oe. It is expected that this shift will be substantially diminished when the Co—Fe—Hf buffer and Ni—Fe seed layers couple to the 1 μm thick Ni—Fe lower shield due to the inverse relationship between $m_s$ and the shift field. Therefore, the Co—Fe—Hf buffer and Ni—Fe seed layers behave as if part of the lower shield.

Since the Ru and Ni—Fe seed layers exhibit hcp and fcc structures needed for developing the epitaxial relationship with the Ir-Mn pinning layer, respectively, the Ru and Ni—Fe seed layers facilitate the Ir-Mn pinning and Co—Fe pinned layers to exhibit comparably high $H_{CE}$, $H_{UA}$ and $J_K$. On the other hand, since the Co—Fe—Hf buffer layer is amorphous, it may establish a new foundation which may affect the growth of the Ni—Fe seed layer and reduce its effect on the development of the epitaxial relationship. As a result, the use of the Co—Fe—Hf buffer and Ni—Fe seed layers lead to lower $H_{UA}$ and $J_K$.

TABLE 1

| Seed Layers (nm) | $m_S$ (memu/cm$^2$) | $H_{CE}$ (Oe) | $H_{UA}$ (Oe) | $J_K$ (erg/cm$^2$) |
|---|---|---|---|---|
| Ta(2)/Ru(2) | 0.56 | 138.5 | 1196.9 | 0.67 |
| Ta(2)/Ni—Fe(2) | 0.56 | 121.1 | 1200.9 | 0.67 |
| Co—Fe—Hf(4)/Ni—Fe(2) | 0.56 | 167.9 | 1040.7 | 0.58 |

Figure 10:
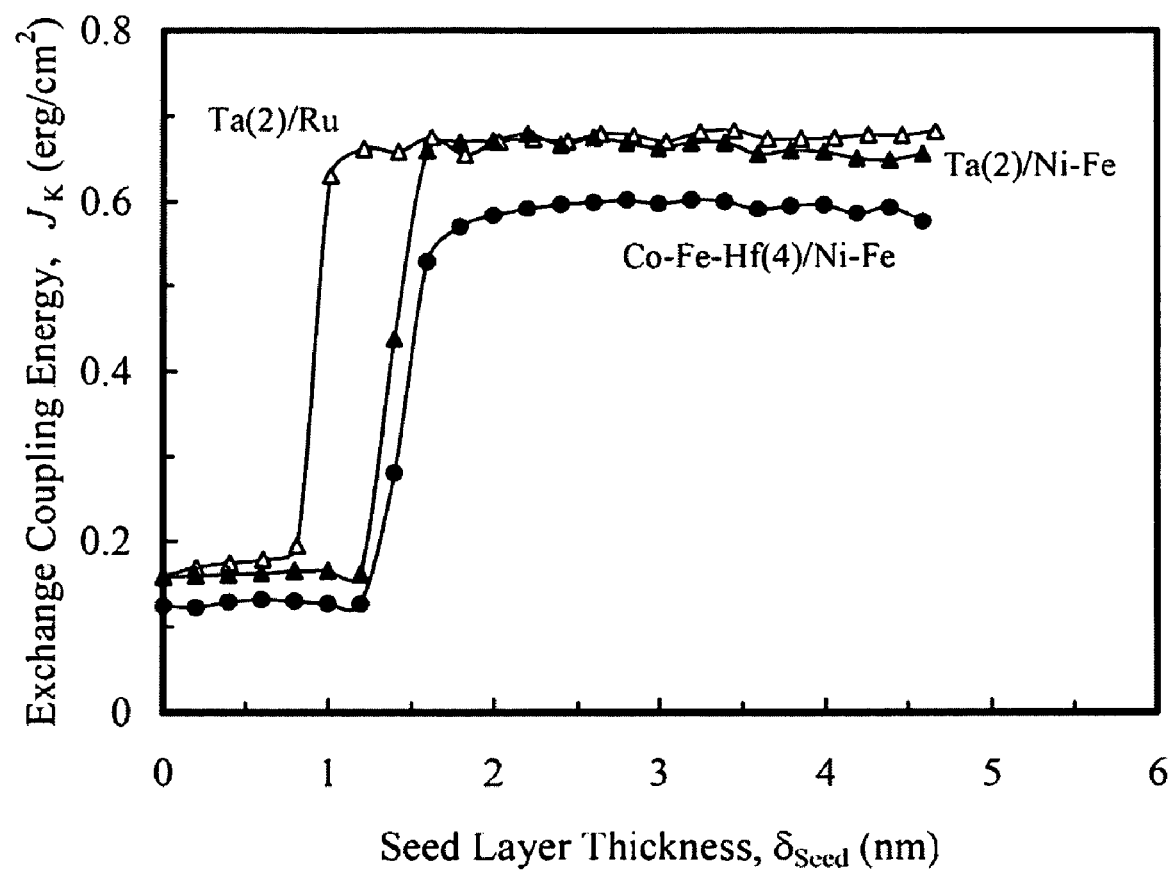
FIG. 10 is a chart showing $J_K$ versus the seed layer thickness ($\delta_{Seed}$) for 21.7Ir-78.3Mn(6)/77.5Co-22.5Fe(3.6) films with various buffer/seed layers and Ru(3)/Ta(3)/Ru(4) cap layers after annealing for 2 hours at 280° C. The buffer/seed layers comprise Ta(2)/Ru, Ta(2)/91.3Ni-8.7 Fe and 66.9Co-9.6Fe-23.5Hf(4)/91.3Ni-8.7Fe films.

FIG. 10 shows $J_K$ versus the seed layer thickness ($\delta_{Seed}$) for 21.7Ir-78.3Mn(6)/77.5Co-22.5Fe(3.6) films with various buffer/seed layers and Ru(3)/Ta(3)/Ru(4) cap layers after annealing for 2 hours at 280° C. The buffer/seed layers comprise Ta(2)/Ru, Ta(2)/91.3Ni-8.7Fe and 66.9Co-9.6Fe-23.5Hf(4)/91.3Ni-8.7Fe films. In order to maximize $J_K$, the Ru and Ni—Fe seed layers on top of the Ta buffer layers require critical thicknesses of 1.2 and 1.6 nm, respectively, and the Ni—Fe seed layer on top of the Co—Fe—Hf buffer layer 2 nm.

Figure 11:
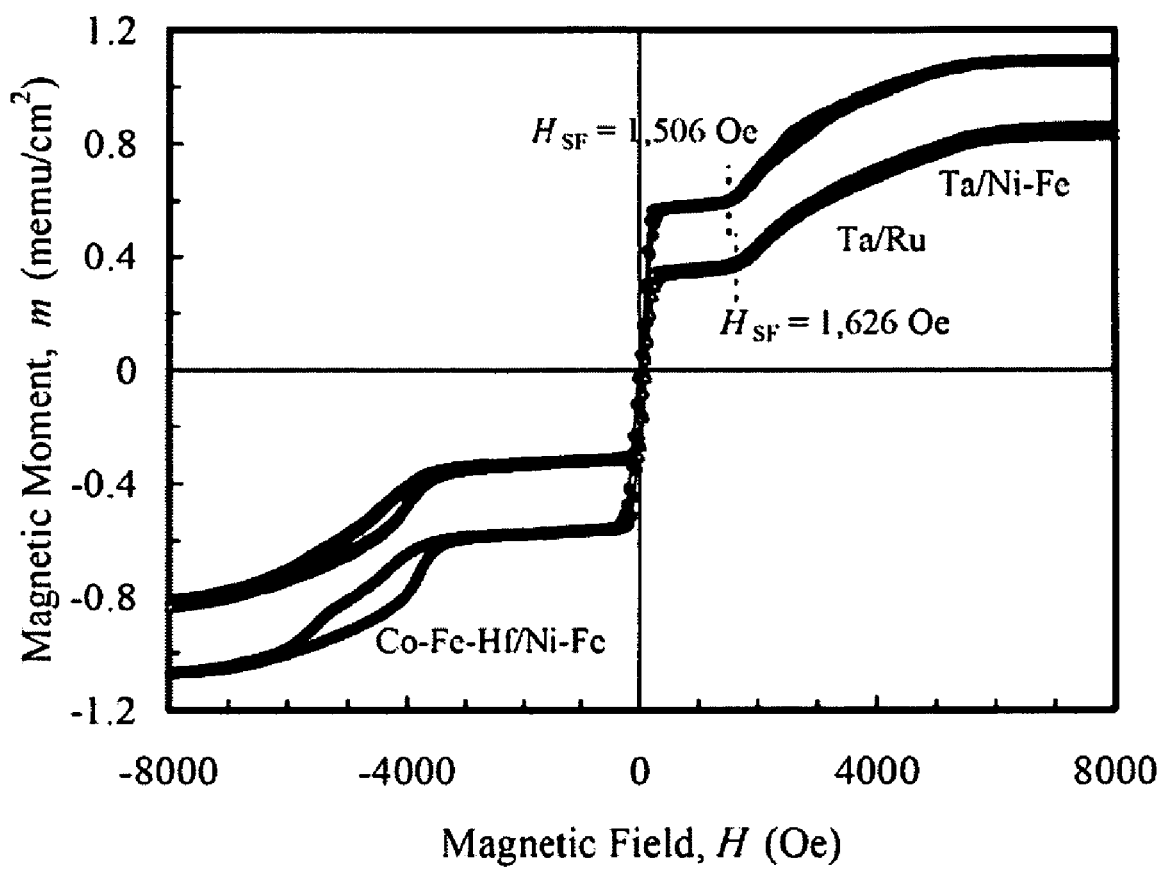
FIG. 11 shows high-field easy-axis magnetic responses of TMR read sensors comprising 21.7Ir-78.3Mn(6)/77.5Co-22.5Fe(2.2)/Ru(0.8)/65.6Co-19.9Fe-14.5B(1.6)/77.5Co-22.5Fe(0.4)/MgO$_x$(0.8)/87.1Co-12.9Fe(0.4)/71.5Co-7.4Fe-21.1B(1.6)/74.0Co-10.8Fe-15.2Hf(1.6)/Ta(2)/Ru(4) films with various buffer/seed layers. The buffer/seed layers comprise Ta(2)/Ru(2), Ta(2)/91.3Ni-8.7Fe(2) and 66.9Co-9.6Fe-23.5Hf(4)/91.3Ni-8.7Fe(2) films.

FIG. 11 shows high-field easy-axis magnetic responses of TMR read sensors comprising 21.7Ir-78.3 Mn(6)/77.5Co-22.5Fe(2)/Ru(0.8)/65.6Co-19.9Fe-14.5B(1.6)/77.5Co-22.5Fe(0.4)/MgO$_x$(0.8)/87.1Co-12.9Fe(0.4)/71.5Co-7.4Fe-21.1B(1.6)/74.0Co-10.8Fe-15.2Hf(1.6)/Ta(2)/Ru(4) films with various buffer/seed layers. The buffer/seed layers comprise Ta(2)/Ru(2), Ta(2)/91.3Ni-8.7Fe(2) and 66.9Co-9.6Fe-23.5Hf(4)/91.3Ni-8.7Fe(2) films. The TMR read sensors with the Ru and Ni—Fe seed layers on top of the Ta buffer layers exhibit nearly identical hysteresis loops with a spin-fold field ($H_{SF}$) of 1,626 Oe, exceeding which the magnetization of the Co—Fe—B/Co—Fe reference layers starts to spin-flop, thus causing instable sensor operation. On the other hand, the TMR read sensor with the Co—Fe—Hf buffer and Ni—Fe seed layers exhibits a hysteresis loop with $H_{SF}$ of 1,506 Oe. This slight $H_{SF}$ difference originates from the $H_{UA}$ difference as described in FIG. 7, and indicates a slight degradation in the pinning strength of the Co—Fe—B/Co—Fe reference layers. In spite of this slight degradation, it is still recommended to use the Co—Fe—Hf buffer and Ni—Fe seed layers for reducing the read gap and thus for increasing the linear density.

Figure 12:
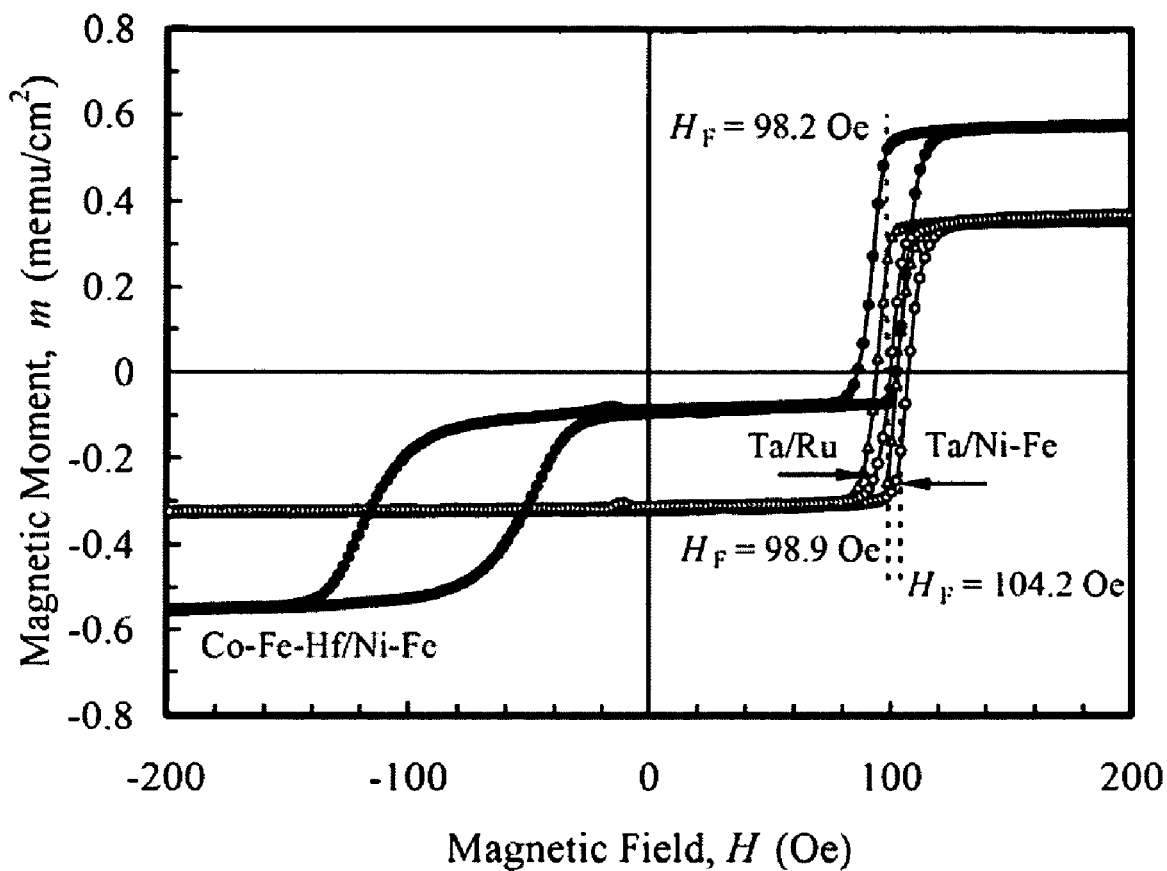
FIG. 12 shows low-field easy-axis magnetic responses of TMR read sensors corresponding to those shown in FIG. 11.

FIG. 12 shows low-field easy-axis magnetic responses of TMR read sensors corresponding to those shown in FIG. 11. The TMR read sensors with the Ru and Ni—Fe seed layers on top of the Ta buffer layers exhibit $H_F$ of 98.9 and 104.2 Oe, respectively, while the TMR read sensor with the Co—Fe—Hf buffer and Ni—Fe seed layers 98.2 Oe. The slightly lower $H_F$ may originate from a smoother surface provided by the Co—Fe—Hf buffer layer. It is expected to further decrease $H_F$ after applying the plasma treatment to the Ni—Fe seed layer on top of the Co—Fe—Hf buffer layer. In addition, the $m_s$ of the Co—Fe—Hf buffer and Ni—Fe seed layers can be determined to be 0.28 memu/cm$^2$ from a hysteresis loop slightly shifted by 68.6 Oe, indicating that the Co—Fe—Hf buffer and Ni—Fe seed layers exchange-couples to the Ir-Mn pinning layer. This exchange coupling will be substantially diminished when the Co—Fe—Hf buffer and Ni—Fe seed layers couple to the 1 μm Ni—Fe lower shield due to the inverse relationship between $m_s$ and the shift field.

Figure 13:
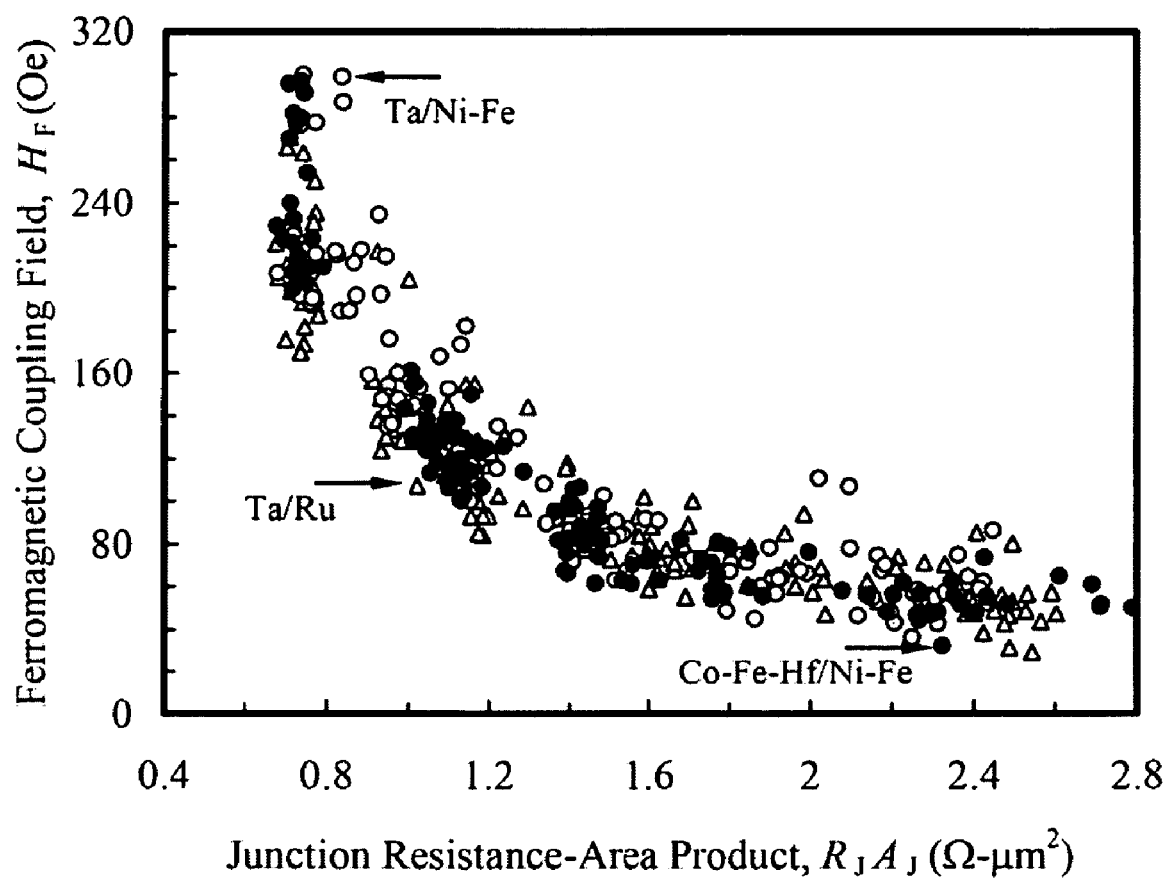
FIG. 13 shows the ferromagnetic coupling field ($H_F$) versus the resistance-area product ($R_JA_J$) for the TMR read sensors corresponding to those shown in FIG. 11.

FIG. 13 shows the ferromagnetic coupling field ($H_f$) versus the resistance-area product ($R_JA_J$) for the TMR read sensors corresponding to those shown in FIG. 11. Although the evidence that the use of the Co—Fe—Hf buffer and Ni—Fe seed layers leads to a lower $H_F$ is not clear, it is still expected that $H_F$ can be further reduced by depositing a thicker Ni—Fe seed layer and applying the plasma treatment to it. It should be noted that while the Ni—Fe seed layer deposited on the Ta seed layer must be thin enough so that its $m_s$ will be diminished due to interface mixing and thus the sensor operation will be stable, the Ni—Fe seed layer deposited on the Co—Fe—Hf seed layer can be as thick as desired since it becomes part of the lower shield.

Figure 14:
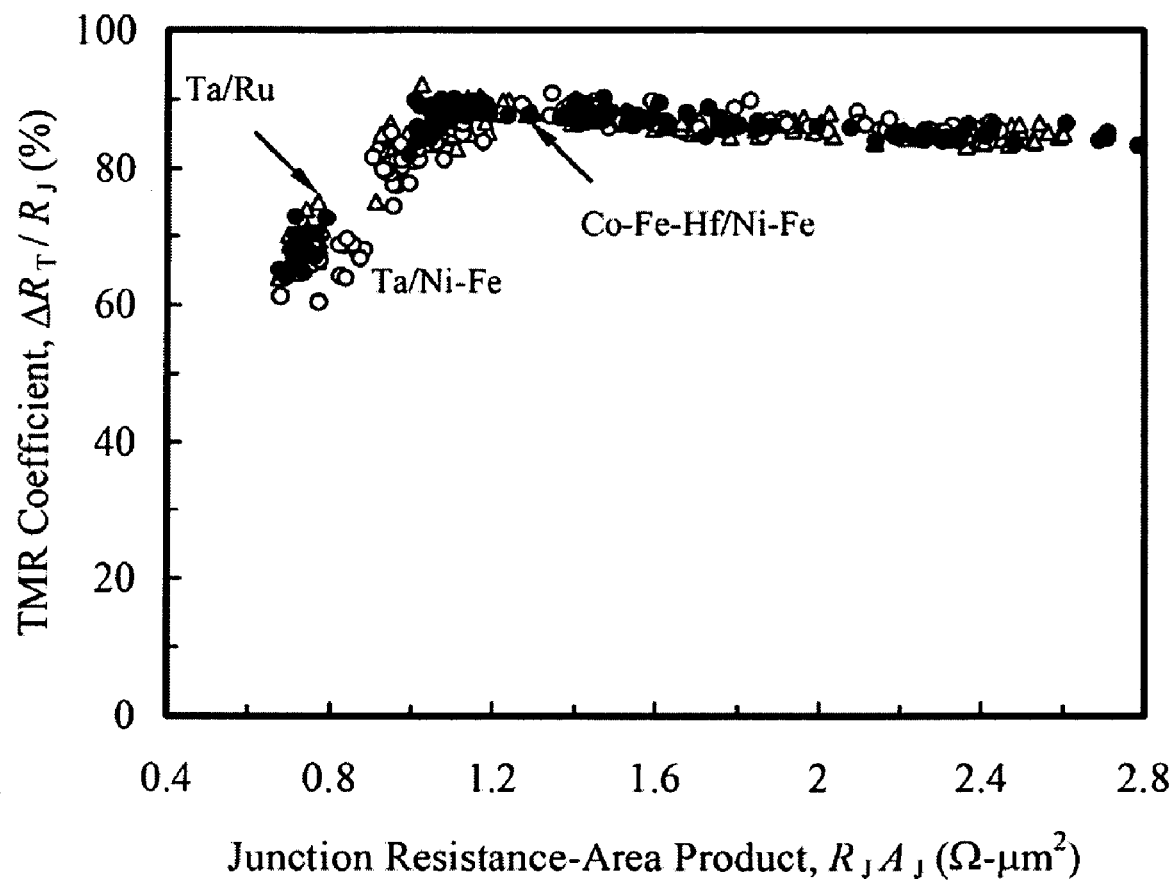
FIG. 14 shows the TMR coefficient ($\Delta R_T/R_J$) versus the resistance-area product ($R_JA_J$) for the TMR read sensors corresponding to those shown in FIG. 11.

FIG. 14 shows the TMR coefficient ($\Delta R_T/R_J$) versus $R_J A_J$ for the TMR read sensors corresponding to those shown in FIG. 11. The TMR read sensors with the three types of buffer/seed layers basically exhibit similar TMR properties. It is believed that by depositing a thicker Ni—Fe seed layer and applying the plasma treatment to it, TMR properties will be improved due to the epitaxial growth of the TMR read sensor on a smoothened Ni—Fe seed layer.

What is claimed is:

1. A CPP tunneling magnetoresistance (TMR) read sensor, comprising:
    a ferromagnetic amorphous buffer layer;
    a ferromagnetic polycrystalline seed layer on the buffer layer;
    an antiferromagnetic pinning layer on the seed layer;
    a ferromagnetic keeper layer on the pinning layer;
    an antiparallel coupling, layer on the keeper layer;
    multiple ferromagnetic reference layers on the antiparallel coupling layer;
    a barrier layer on the multiple reference layers;
    multiple ferromagnetic sense layers on the barrier layer;
    a nonmagnetic cap layer on the multiple sense layers; and
    a ferromagnetic cap layer on the nonmagnetic cap layer;
    wherein the multiple sense layers comprise:
    a first sense layer formed by a Co—Fe film;
    a second sense layer formed by a Co—Fe—B film; and
    a third sense layer formed by a Co—Fe—Hf film.

2. The CPP TMR read sensor of claim 1 wherein the ferromagnetic amorphous buffer layer is formed by a Co—Fe—X film (where X is Hf, Zr or Y) containing Co with a content ranging from 60 to 80 at %, Fe with a content ranging from 0 to 40 at %, and X with a content ranging from 6 to 30 at %, and having a thickness ranging from 0.4 to 20 nm.

3. The CPP TMR read sensor of claim 1 wherein the ferromagnetic polycrystalline seed layer is formed by a Ni—Fe—X film (where X is Cu, Cr, Rh, Ru, Ti or W) containing Ni with a content ranging from 60 to 100 at %, Fe with a content ranging from 0 to 40 at %, and X with a content ranging from 0 to 10 at %, and having a thickness ranging from 2 to 40 nm.

4. The CPP TMR read sensor of claim 1 wherein the antiferromagnetic pinning layer is formed by an Ir-Mn film.

5. The CPP TMR read sensor of claim 1 wherein the ferromagnetic keeper layer is formed by a Co—Fe film.

6. The CPP TMR read sensor of claim 1 wherein the antiparallel coupling layer is formed by a Ru film.

7. The CPP TMR read sensor of claim 1 wherein the multiple ferromagnetic reference layer further comprises a first reference layer formed by a Co—Fe—B film and a second reference layer formed by a Co—Fe film.

8. The CPP TMR read sensor of claim 1 wherein the barrier layer is formed by an electrically insulating nanomagnetic $MgO_x$ film.

9. The CPP TMR read sensor of claim 1 wherein the nonmagnetic cap layer is formed by a Ta film.

10. A CPP tunneling magnetoresistance (TMR) read sensor, comprising:
    a ferromagnetic amorphous buffer layer;
    a ferromagnetic polycrystalline seed layer on the buffer layer;
    an antiferromagnetic pinning layer on the seed layer;
    a ferromagnetic keeper layer on the pinning layer;
    an antiparallel coupling layer on the keeper layer;
    multiple ferromagnetic reference layers on the antiparallel coupling layer;
    a barrier layer on the multiple reference layers;
    multiple ferromagnetic sense layers on the barrier layer;
    a nonmagnetic cap layer on the multiple sense layers; and
    a ferromagnetic cap layer on the nonmagnetic cap layer;
    wherein the ferromagnetic cap layer is formed by a Ni—Fe—X film (where X is Cu, Cr, Rh, Ru, Ti or W) containing Ni with a content ranging from 60 to 100 at %, Fe with a content ranging from 0 to 40 at %, and X with a content ranging from 0 to 10 at %, and having a thickness ranging from 2 to 40 nm.

11. A CPP giant magnetoresistance (GMR) read sensor, comprising:
    a ferromagnetic amorphous buffer layer;
    a ferromagnetic polycrystalline seed layer on the buffer layer;
    an antiferromagnetic pinning layer on the seed layer;
    a ferromagnetic keeper layer on the pinning layer;
    an antiparallel coupling layer on the keeper layer;
    ferromagnetic reference layer on the antiparallel coupling layer;
    a spacer layer on the reference layer;
    multiple ferromagnetic sense layers on the spacer layer; and
    a ferromagnetic cap layer on the sense layer;
    wherein the multiple sense layers comprise:
    a first sense layer formed by a Co—Fe film;
    a second sense layer formed by a Co—Fe—B film; and
    a third sense layer formed by a Co—Fe—Hf film.

12. The CPP GMR read sensor of claim 11 wherein the ferromagnetic amorphous buffer layer is formed by a Co—Fe—X film (where X is Hf, Zr or Y) containing Co with a content ranging from 60 to 80 at %, Fe with a content ranging from 0 to 40 at %, and X with a content ranging from 6 to 30 at %, and having a thickness ranging from 0.4 to 20 nm.

13. The GMR read sensor of claim 11 wherein the ferromagnetic polycrystalline seed layer is formed by a Ni—Fe—X film (where Y is Cu, Cr, Rh, Ru, Ti or W) containing Ni with a content ranging from 60 to 100 at %, Fe with a content ranging from 0 to 40 at %, and X with a content ranging from 0 to 10 at %, and having a thickness ranging from 2 to 40 nm.

14. The GMR read sensor of claim 11 wherein the ferromagnetic cap layer is formed by a Ni—Fe—X film (where X is Cu, Cr, Rh, Ru, Ti or W) containing Ni with a content ranging from 60 to 100 at %, Fe with a content ranging from 0 to 40 at %, and X with a content ranging from 0 to 10 at %, and having a thickness ranging from 2 to 40 nm.

15. The CPP GMR read sensor of claim 11 wherein an additional ferromagnetic reference layer formed by a Co—Fe—X film (where X is Hf, Zr, Y, Al, Ge or Si) is incorporated.

16. The CPP GMR read sensor of claim 11 wherein the spacer layer is formed by an electrically conducting nonmagnetic Cu—O film.

17. The CPP GMR read sensor of claim 11 wherein an additional ferromagnetic sense layer formed by a Ni—Fe—X film (where X is Cu, Cr, Rh, Ru, Ti or W) is incorporated.

18. A dual CPP GMR read sensor, comprising:
a ferromagnetic amorphous buffer layer;
a ferromagnetic polycrystalline seed layer on the buffer layer;
a first antiferromagnetic pinning layer on the seed layer;
a first ferromagnetic keeper layer on the first pinning layer;
a first antiparallel coupling layer on the first keeper layer;
a first ferromagnetic reference layer on the first antiparallel coupling layer;
a first nonmagnetic spacer layer on the first reference layer;
multiple ferromagnetic sense layers on the first spacer layer;
a second nonmagnetic spacer layer on the sense layer;
a second ferromagnetic reference layer on the second spacer layer;
a second antiparallel coupling layer on the second reference layer;
a second ferromagnetic keeper layer on the second reference layer;
a second antiferromagnetic pinning layer on the second keeper layer; and
a ferromagnetic cap layer on second pinning layer;
wherein the multiple sense layers comprise:
a first sense layer formed by a Co—Fe film;
a second sense layer formed by a Co—Fe—B film; and
a third sense layer formed by a Co—Fe—Hf film.

19. The CPP GMR read sensor of claim 18 wherein the ferromagnetic amorphous buffer layer is formed by a Co—Fe—X film (where X is Hf, Zr or Y) containing Co with a content ranging from 60 to 80 at %, Fe with a content ranging from 0 to 40 at %, and X with a content ranging from 6 to 30 at %, and having a thickness ranging from 0.4 to 20 nm.

20. The CPP GMR read sensor of claim 18 wherein the ferromagnetic polycrystalline seed layer is formed by a Ni—Fe—X film (where X is Cu, Cr, Rh, Ru, Ti or W) containing Ni with a content ranging from 60 to 100 at %, Fe with a content ranging from 0 to 40 at %, and X with a content ranging from 0 to 10 at %, and having a thickness ranging from 2 to 40 nm.

* * * * *